United States Patent
Tsuzuki et al.

(10) Patent No.: US 8,339,162 B2
(45) Date of Patent: Dec. 25, 2012

(54) CIRCUIT DEVICE AND METHOD OF CONTROLLING CIRCUIT DEVICE

(75) Inventors: Toshihide Tsuzuki, Kawasaki (JP); Hirotoshi Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/770,030

(22) Filed: Apr. 29, 2010

(65) Prior Publication Data
US 2010/0207668 A1   Aug. 19, 2010

Related U.S. Application Data

(63) Continuation of application No. PCT/JP2007/071798, filed on Nov. 9, 2007.

(51) Int. Cl.
*H03B 1/00* (2006.01)
(52) U.S. Cl. .................................... 327/108
(58) Field of Classification Search ............ 327/158
See application file for complete search history.

(56) References Cited

U.S. PATENT DOCUMENTS 7,057,431 B2 * 6/2006 Kwak .................... 327/158

FOREIGN PATENT DOCUMENTS

| JP | 04-243349 | 8/1992 |
|---|---|---|
| JP | 11-17518 | 1/1999 |
| JP | 2000-181591 | 6/2000 |
| JP | 2000-341177 | 12/2000 |
| JP | 2006-60751 | 3/2006 |
| JP | 2006-148389 | 6/2006 |
| JP | 2007-36546 | 2/2007 |

OTHER PUBLICATIONS

English language International Search Report mailed Dec. 11, 2007 for International Application No. PCT/JP2007/071798.

* cited by examiner

*Primary Examiner* — Lincoln Donovan
*Assistant Examiner* — Daniel Rojas
(74) *Attorney, Agent, or Firm* — Staas & Halsey LLP

(57) ABSTRACT

A circuit device has a first output buffer including a first adjustment circuit for adjusting a level of the first output signal, a first input buffer connected to the first output buffer, an adjustment controller for outputting a test signal to the first output buffer, outputting a control signal to the first adjustment circuit so that the level of the first output signal is adjusted on the basis of the control signal, monitoring an output of the first input buffer, and adjusting the control signal on the basis of the monitoring the output of the first input buffer, a second output buffer connected to the adjustment controller and operable to assume either an active or a nonactive state, for outputting a second output signal when controlled to assume an active state, including a second adjustment circuit, and a second input buffer.

17 Claims, 6 Drawing Sheets

US 8,339,162 B2

CIRCUIT DEVICE AND METHOD OF CONTROLLING CIRCUIT DEVICE

CROSS-REFERENCE TO RELATED APPLICATION

This is a continuation of Application PCT/JP2007/071798, filed on Nov. 9, 2007, the entire contents of which are incorporated herein by reference.

FIELD

The present art relates to a circuit device for receiving and transmitting data from and to a different data transfer circuit using a bi-directional bus and a method for adjusting the data transfer circuit.

BACKGROUND

In order to reduce the number of terminals and interconnection lines, many electronic circuit devices having a plurality of large scale integration (LSI) chips mounted on a circuit board include a data transfer circuit using a bi-directional bus. In such a case, a bi-directional buffer incorporated into an LSI chip and serving as an I/O circuit is connected to the bi-directional bus formed on the circuit board. The bi-directional buffer is controlled so as to stay in an input state or an output state. Thus, the bi-directional buffer has a data input function and a data output function. An output circuit formed in the bi-directional buffer includes a tri-state buffer that can control switching between an active state and an inactive state. When the output buffer enters an inactive state, the input circuit is controlled to receive a logic signal on the bi-directional bus.

The input and output voltage of a bi-directional buffer (i.e., the logical amplitude of a signal on a bi-directional bus) has been decreased in order to reduce power consumption. When a digital signal having a small logical amplitude is transferred via a bi-directional bus, the digital signal tends to be easily affected by parasitic capacitance and noise. Accordingly, in order to increase the noise immunity, it is desirable that an output voltage be set to a value having an optimal margin for an input logical threshold voltage. The optimization of the input threshold voltage and the output voltage also increases the data transfer rate and decreases the power consumption. On the other hand, the characteristics of an input and output transistor of the bi-directional buffer and the impedance of an input and output path are affected by variations in the process for manufacturing an LSI chip and a circuit board and, therefore, are changed from the design values. In addition, the optimal output voltage varies in accordance with the use environment of a manufactured electronic circuit device (in particular, the power supply voltage and the ambient temperature). Therefore, in order to obtain the optimal margin, it is desirable that, after the LSI chip is mounted on the circuit board of an apparatus and the apparatus is realized, the output voltage of the output buffer be adjusted when an initial test is conducted or every time the apparatus is started and, thus, the output voltage be set to the optimal value.

[Patent Document 1] Japanese Laid-open Patent Publication No. 11-017518
[Patent Document 2] Japanese Laid-open Patent Publication No. 2006-060751
[Patent Document 3] Japanese Laid-open Patent Publication No. 2007-036546

SUMMARY

According to an aspect of an embodiment, a circuit device has a first output buffer for outputting a first output signal, including a first adjustment circuit for adjusting a level of the first output signal, a first input buffer connected to the first output buffer for receiving the first output signal, an adjustment controller for outputting a test signal to the first output buffer, outputting a control signal to the first adjustment circuit so that the level of the first output signal is adjusted on the basis of the control signal, monitoring an output of the first input buffer, and adjusting the control signal on the basis of the monitoring the output of the first input buffer, a second output buffer connected to the adjustment controller and operable to assume either an active or a non-active state, for outputting a second output signal when controlled to assume an active state, including a second adjustment circuit for adjusting a level of the second output signal on the basis of the adjusted control signal outputted from the adjustment controller, and a second input buffer for receiving an input signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

In such existing techniques, the adjustment circuit sets one of two bi-directional buffers disposed so as to face each other with a bi-directional bus therebetween to an output mode and sets the other bi-directional buffer to an input mode. Thereafter, the adjustment circuit searches for the optimal value of the output voltage. More specifically, the adjustment circuit gradually increases or decreases the setting value of one of the output voltages while monitoring the logical threshold voltage of the other buffer (an input circuit). Thus, the adjustment circuits search for the value of the output voltage for an optimal margin. In order to perform such an adjustment operation, signal lines and terminals used for controlling the input and output modes and monitoring the input threshold value are needed between the two bi-directional buffers. Such an increase in the number of signal lines and terminals increases the costs of the circuit board and the LSI chip and, therefore, increases the cost of the electronic apparatus.

An embodiment of the present invention is described below with reference to the accompanying drawings.

Figure 1:
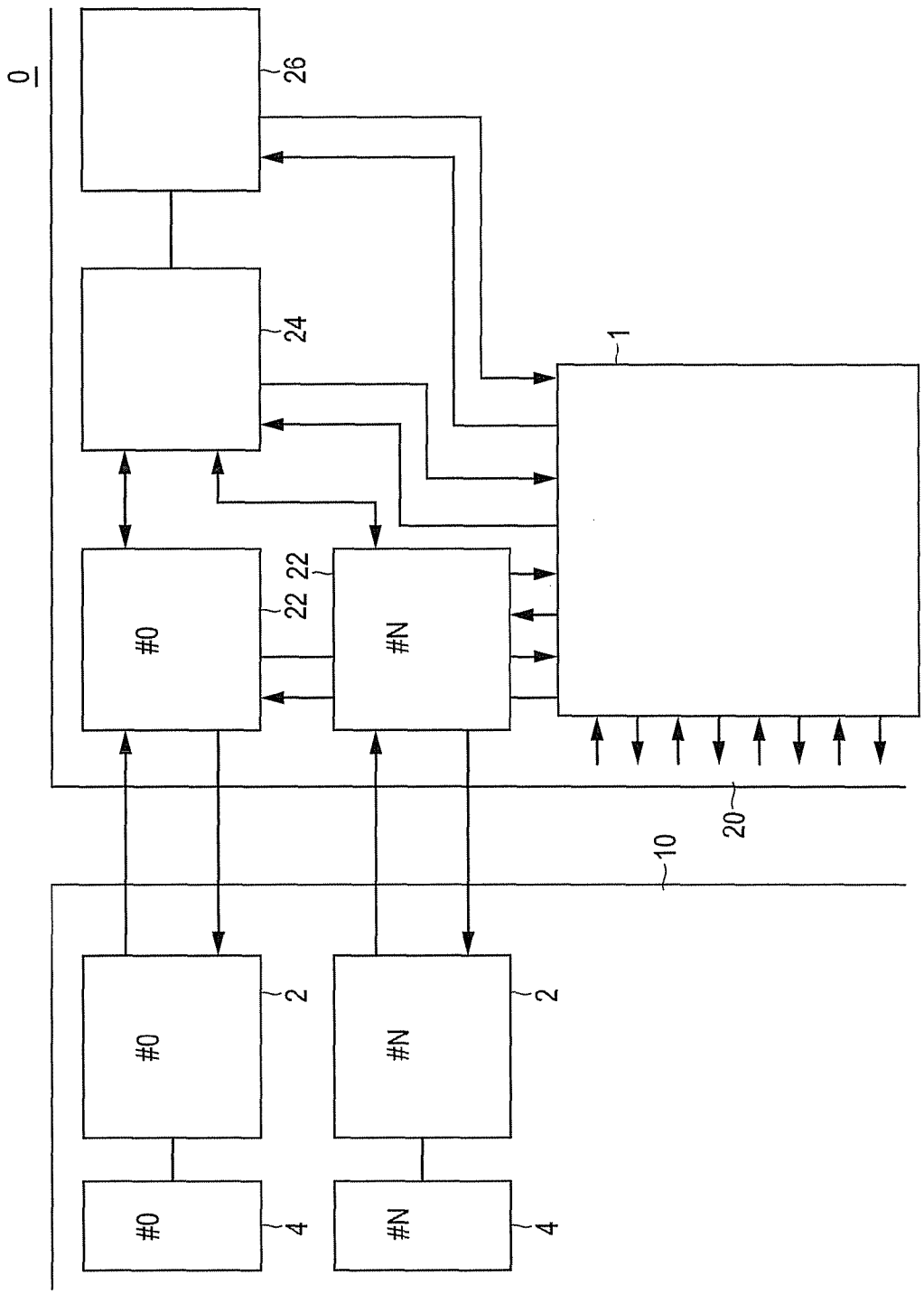
FIG. 1 illustrates an exemplary hardware configuration of an information processing apparatus.

Information Processing Apparatus:

FIG. 1 illustrates an information processing apparatus 0. The information processing apparatus 0 includes a processor unit 10 and a memory unit 20. The processor unit 10 includes, for example, (N+1) central processing units (CPUs) 4 each having a unit interface control device 2 connected thereto. The memory unit 20 includes, for example, (N+1) unit interface control devices 22, a memory controller 24, a memory module 26, and a system control device 1 connected to the (N+1) unit interface control devices 22, the memory controller 24, and the memory module 26.

Each of the CPUs 4 sends, to the unit interface control device 2, an instruction to write data or an instruction to read data. The unit interface control device 2 transfers the instruction received from the CPU 4 to a corresponding one of the unit interface control devices 22. The unit interface control device 22 sends the instruction transferred from the unit interface control device 2 to the memory controller 24. The memory controller 24 accesses the memory module 26 on the basis of the instruction received from the unit interface control device 22 and writes or reads data. The system control device 1 disposed in the memory unit 20 controls a direction in which the data is transmitted or received in the unit interface control device 22 and the memory controller 24.

A data transfer circuit according to the present embodiment is described next.

Figure 2:
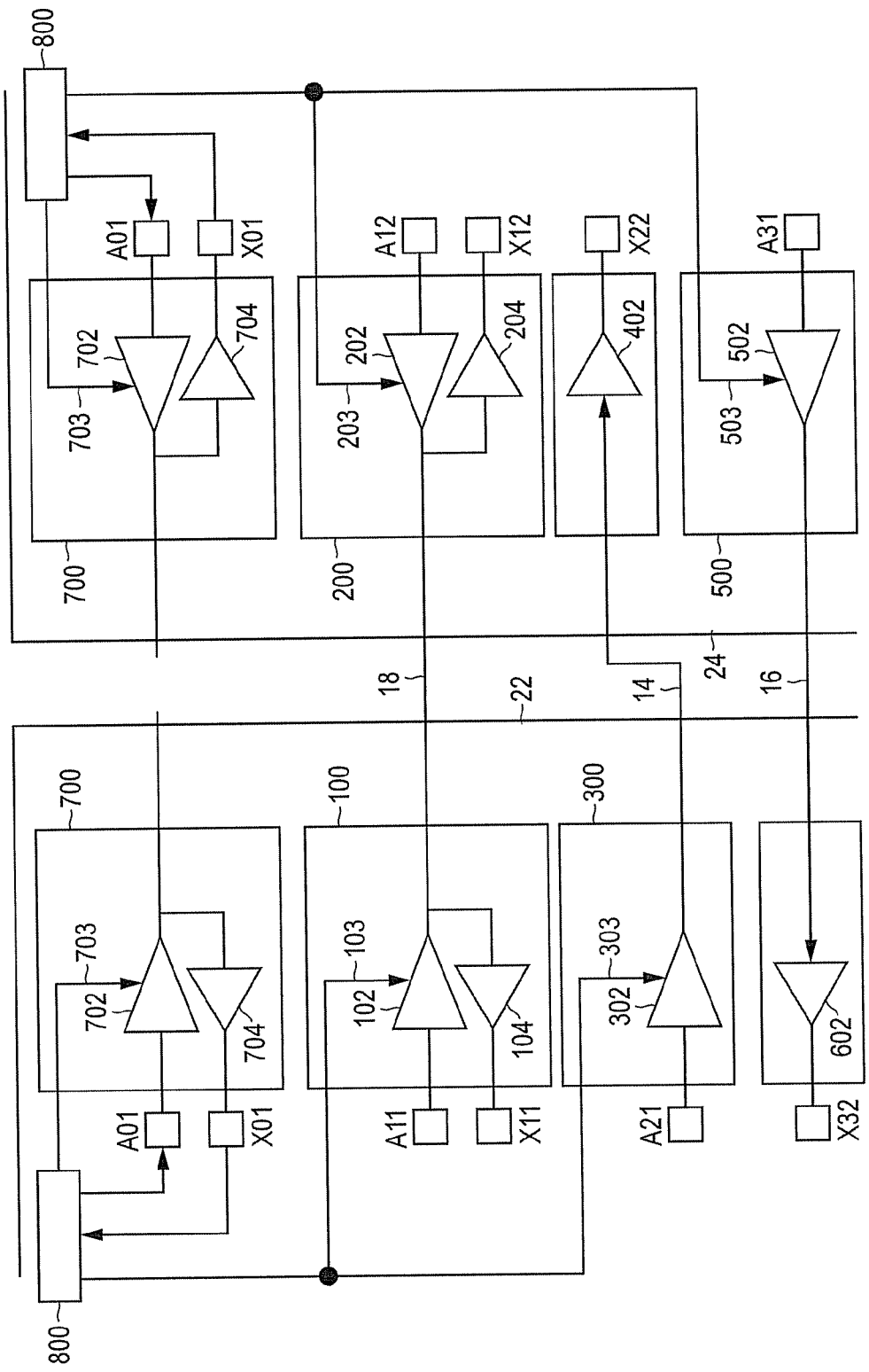
FIG. 2 is a first diagram illustrating a relationship between a bi-directional buffer and an adjusting bi-directional buffer.

FIG. 2 illustrates bi-directional buffers 100 and 200. The bi-directional buffer 100 includes an output driver 102 and an input buffer 104. For example, the bi-directional buffer 100 is disposed in the unit interface control device 22, and the bi-directional buffer 200 is disposed in the memory controller 24. The output driver 102 has an off chip driver (OCD), which is a function of controlling the output level of the output driver 102.

The output driver 102 receives a signal input through an input end A11. The output driver 102 outputs a signal on the basis of a bi-directional bus control signal output from the system control device 1 of the memory unit 20. When the bi-directional buffer 100 is set to transmit a signal, the output driver 102 outputs the signal to an input buffer 204 of the bi-directional buffer 200 via a bi-directional bus 18. When the bi-directional buffer 100 is set to transmit a signal, the bi-directional buffer 200 is set to receive the signal. Accordingly, the input buffer 204 outputs, from an output end X12, the signal input from the output driver 102. However, when the bi-directional buffer 100 is set to receive a signal, the output driver 102 does not output a signal. In such a case, since the bi-directional buffer 200 is set to transmit a signal, the signal input through an input end A12 is output to the input buffer 104 of the bi-directional buffer 100 via the bi-directional bus 18. The input buffer 104 output, through an output end X11, the signal input from an output driver 202.

FIG. 2 also illustrates an output buffer 300. For example, the output buffer 300 is disposed in the unit interface control device 22 shown in FIG. 1. The output buffer 300 includes an output driver 302. The output driver 302 has an OCD. The output driver 302 receives a signal through an input end A21. The output driver 302 outputs a signal to an input buffer 402 via a bus 14. The input buffer 402 outputs, through an output end X22, the signal input from the output driver 302. The output buffer 300 outputs, for example, a signal that indicates completion of transmitting a signal.

FIG. 2 also illustrates an input buffer 602. For example, an output buffer 500 is disposed in the unit interface control device 22 shown in FIG. 1. The input buffer 602 receives a signal from an output driver 502 of the output buffer 500 via a bus 16. The input buffer 602 outputs, through an output end X32, the signal input from the output driver 502. Note that the output driver 502 receives a signal through an input end A31.

An adjusting bi-directional buffer 700 serving as a test circuit is shown in FIG. 2. The adjusting bi-directional buffer 700 is disposed in each of the unit interface control device 22 and the memory controller 24. Hereinafter, the adjusting bi-directional buffer 700 disposed in the unit interface control device 22 is described. The adjusting bi-directional buffer 700 includes an output driver 702 and an input buffer 704. The output driver 702 has an OCD. The output of the adjusting bi-directional buffer 700 is open and is not connected to any other bi-directional buffer. Accordingly, an output of the output driver 702, which is also an output of the adjusting bi-directional buffer 700, is input to the input buffer 704. In addition, OCD adjustment control means 800 is connected to the output driver 702 and the input buffer 704 via an input end A01 and an output end X01, respectively.

The OCD adjustment control means 800 inputs a signal to the output driver 702 through the input end A01. The signal is used to instruct the output driver 702 to output a high signal or a low signal. The output of the output driver 702 is input to the input buffer 704. The input buffer 704 outputs a high signal or a low signal to the OCD adjustment control means 800 through the output end X01 in accordance with the signal input from the output driver 702. In addition, the OCD adjustment control means 800 inputs, through an adjustment terminal 703, an adjustment signal that adjusts the output level of the output driver 702. The OCD adjustment control means 800 adjusts the output level of the output driver 702 on the basis of the adjustment signal input through the adjustment terminal 703 and the signal received from the input buffer 704. When the output level of the output driver 702 becomes optimum, the OCD adjustment control means 800 applies the adjustment signal input from the adjustment terminal 703 to the output driver 702 to the bi-directional buffers 100 and 200 and the output buffers 300 and 500. More specifically, the OCD adjustment control means 800 inputs the adjustment signal from adjustment terminals 103, 203, 303, and 503 to the output drivers 102 and 202 and the output drivers 302 and 502, respectively. In this way, an adjusted value determined by the adjusting bi-directional buffer 700, which is equivalent to each of the bi-directional buffers 100 and 200, can be applied to the output driver (e.g., the bi-directional buffer 100). Furthermore, since the adjusting bi-directional buffer 700 is not connected to any other bi-directional buffer, the output level of the output driver can be adjusted at any time. Still furthermore, since the need for performing control in order to determine the direction in which a signal flows between the adjusting bi-directional buffer 700 and the bi-directional buffer serving as a destination of the output is eliminated, a time required for adjusting the output to the output driver can be decreased.

Exemplary processing performed by the OCD adjustment control means 800 is described below with reference to FIG. 3.

In step S001, the OCD adjustment control means 800 sets the output driver 702 to an adjustment mode in order to start adjusting the output level of the output driver 702 of the adjusting bi-directional buffer 700. More specifically, the OCD adjustment control means 800 inputs a signal for setting the output driver 702 to an adjustment mode to the output driver 702 via the adjustment terminal 703. Thereafter, the processing proceeds to step S002.

In step S002, the OCD adjustment control means 800 starts setting of a positive channel metal oxide semiconductor (PMOS) of the output driver 702. Thereafter, the processing proceeds to step S003.

In step S003, the OCD adjustment control means 800 inputs, via the input end A01, a signal for instructing the output driver 702 to output a high signal. Thereafter, the processing proceeds to step S004.

In step S004, the input buffer 704 determines whether the signal input from the output driver 702 is a high signal. More specifically, the input buffer 704 compares the signal input from the output driver 702 with a reference voltage in order to determine whether the signal input from the output driver 702 is a high signal. Upon receiving the signal for instructing the output driver 702 to output a high signal through the input end A01, the output driver 702 acquires power from a power supply in the adjusting bi-directional buffer 700 and outputs a high signal. For example, for stub series terminated logic-18 (SSTL-18) bi-directional buffers, the reference voltage is set to 0.9 V. In addition, according to the present embodiment, the high signal has a value of 1.15 V (=0.9 V+0.25 V) or higher. In addition, for SSTL-18 bi-directional buffers, the power supply supplies 1.8 V. The input buffer 704 determines whether the level of the signal input from the output driver 702 is higher than or equal to 1.15 V. If the level of the input signal is higher than or equal to 1.15 V, the input buffer 704 outputs a high signal to the OCD adjustment control means 800 via the output end X01. However, if, as described below, the level of the input signal is lower than or equal to 0.65 V, the input buffer 704 outputs a low signal to the OCD adjustment control means 800 via the output end X01. If the signal output from the output end X01 is a high signal, the processing proceeds to step S007, where a negative channel metal oxide semiconductor (NMOS) of the output driver 702 is adjusted. However, if the signal output from the output end X01 is not a high signal, the processing proceeds to step S005, where the output level of the output driver 702 is adjusted.

In step S005, the OCD adjustment control means 800 determines whether a value DRVP of an adjustment signal input from the adjustment terminal 703 to the output driver 702 has been maximized. According to the present embodiment, for example, a 4-bit adjustment signal is input from the adjustment terminal 703 to the output driver 702. More specifically, bits "0000", "0001", . . . "1111" are sequentially input. By changing the adjustment signal in this manner, the output level of the output driver 702 is adjusted in a stepwise manner. Thus, adjustment is performed so that the output driver 702 outputs a signal of 1.15 V or higher when a signal for instructing the output driver 702 to output a high signal is input. Note that any number of bits of the input adjustment signal can be used. If the value of the adjustment signal has been maximized, the processing proceeds to step S007. However, if the value of the adjustment signal has not been maximized, the processing proceeds to step S006.

In step S006, the OCD adjustment control means 800 increments the value of the adjustment signal by one and inputs the adjustment signal to the output driver 702 through the adjustment terminal 703. For example, if the input adjustment signal is "0000", the value is changed to "0001" by incrementing the value of the adjustment signal. Thereafter, the processing returns to step S004.

If, in step S004, the OCD adjustment control means 800 determines that the signal input from the output end X01 is a high signal, adjustment of the PMOS is completed. Thereafter, the processing proceeds to step S007. However, if, in step S004, the OCD adjustment control means 800 determines that the signal input from the output end X01 is not a high signal, the processing proceeds to step S006 via step S005. In step S006, the value of the adjustment signal is changed in the above-described manner so that the output of the output driver 702 is optimum.

In step S007, the OCD adjustment control means 800 starts setting of the NMOS of the output driver 702. The processing proceeds to step S008.

In step S008, the OCD adjustment control means 800 inputs, through the input end A01, the signal for causing the output driver 702 to output a low signal. For example, in the SSTL-18 bi-directional buffer, a low signal has a value of 0.65 V, which is a value obtained by subtracting 0.25 V from 0.9 V. Thereafter, the processing proceeds to step S009.

In step S009, the input buffer 704 determines whether the signal output from the output driver 702 is a low signal. More specifically, the input buffer 704 determines whether the signal input from the output driver 702 is a low signal by comparing the level of the input signal with a reference voltage. In the present embodiment, as described in step S004, the voltage of the reference signal is 0.9 V. Accordingly, the input buffer 704 determines whether the level of the input signal is lower than or equal to 0.65 V. If the level of the input signal is lower than or equal to 0.65 V, the processing proceeds to step S012. However, if the level of the input signal is not lower than or equal to 0.65 V, the processing proceeds to step S010.

In step S010, the OCD adjustment control means 800 determines whether the value (DRVN) of the adjustment signal input from the adjustment terminal 703 to the output driver 702 has been maximized. A 4-bit adjustment signal is input from the adjustment terminal 703. By changing the adjustment signal, the output of the output driver 702 is adjusted in a stepwise manner. If the value of the adjustment signal is maximized, the processing proceeds to step S012. However, if the adjustment signal has not been maximized, the processing proceeds to step S011.

In step S011, the OCD adjustment control means 800 increments the value of the adjustment signal by one and inputs the adjustment signal to the output driver 702 via the adjustment terminal 703. Thereafter, the processing returns to step S009.

If, in step S009, the OCD adjustment control means 800 determines that the signal input from the output end X01 is a low signal, the setting for adjustment of the NMOS is completed. Thereafter, the processing proceeds to step S012. However, the OCD adjustment control means 800 determines that the signal input from the output end X01 is not a low signal, the processing proceeds to step S011 via step S010. In step S011, as described above, the value of the adjustment signal is changed so that the output of the output driver 702 is optimized.

In step S012, the OCD adjustment control means 800 applies the value of the adjustment signal obtained in step S004 and the value of the adjustment signal obtained in step S009 to the bi-directional buffer 100 and the output buffer 300. More specifically, the OCD adjustment control means 800 inputs the adjustment signal to the output driver 102 via the adjustment terminal 103 and inputs the adjustment signal to the output driver 302 via the adjustment terminal 303. Thereafter, the processing proceeds to step S013. In this way, the adjustment signal obtained by controlling the output driver in the adjusting bi-directional buffer 700 can be applied to each of the bi-directional buffer 100 and the output buffer 300. Accordingly, immediately after the adjusting bi-directional buffer 700 acquires the adjustment signal, the bi-directional buffer 100 and the output buffer 300 are available. In addition, if the value of the adjustment signal reaches the maximum value in step S005 and step S010, the OCD adjustment control means 800 determines that the adjustment operation is completed at that time.

In step S013, in order to complete the adjustment operation to control the output of the output driver 702, the OCD adjustment control means 800 terminates the adjustment mode of the output driver 702. More specifically, the OCD adjustment control means 800 inputs a signal for terminating the adjustment mode of the output driver 702 to the output driver 702 via the adjustment terminal 703. Thereafter, the processing is completed.

Figure 3:
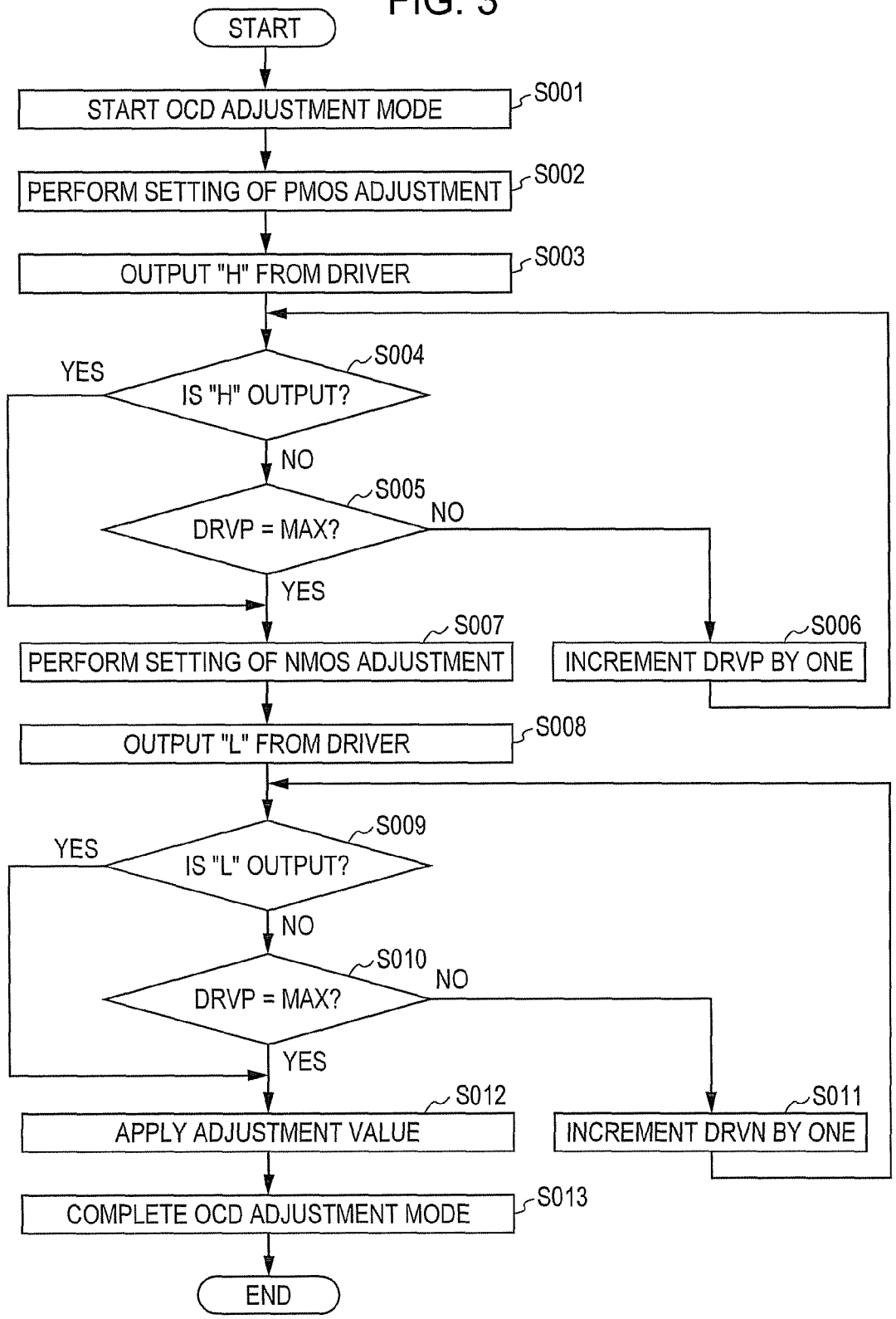
FIG. 3 is a flowchart of an adjustment process.

Note that the OCD adjustment control means 800 can be realized by implementing firmware that executes the program steps of the flowchart shown in FIG. 3 in any processor or a sequencer that is well known in the art. It is desirable that the processor or sequencer serving as the OCD adjustment control means 800 be incorporated into the unit interface control device 22 or the memory controller 24, which is an LSI chip.

Figure 4:
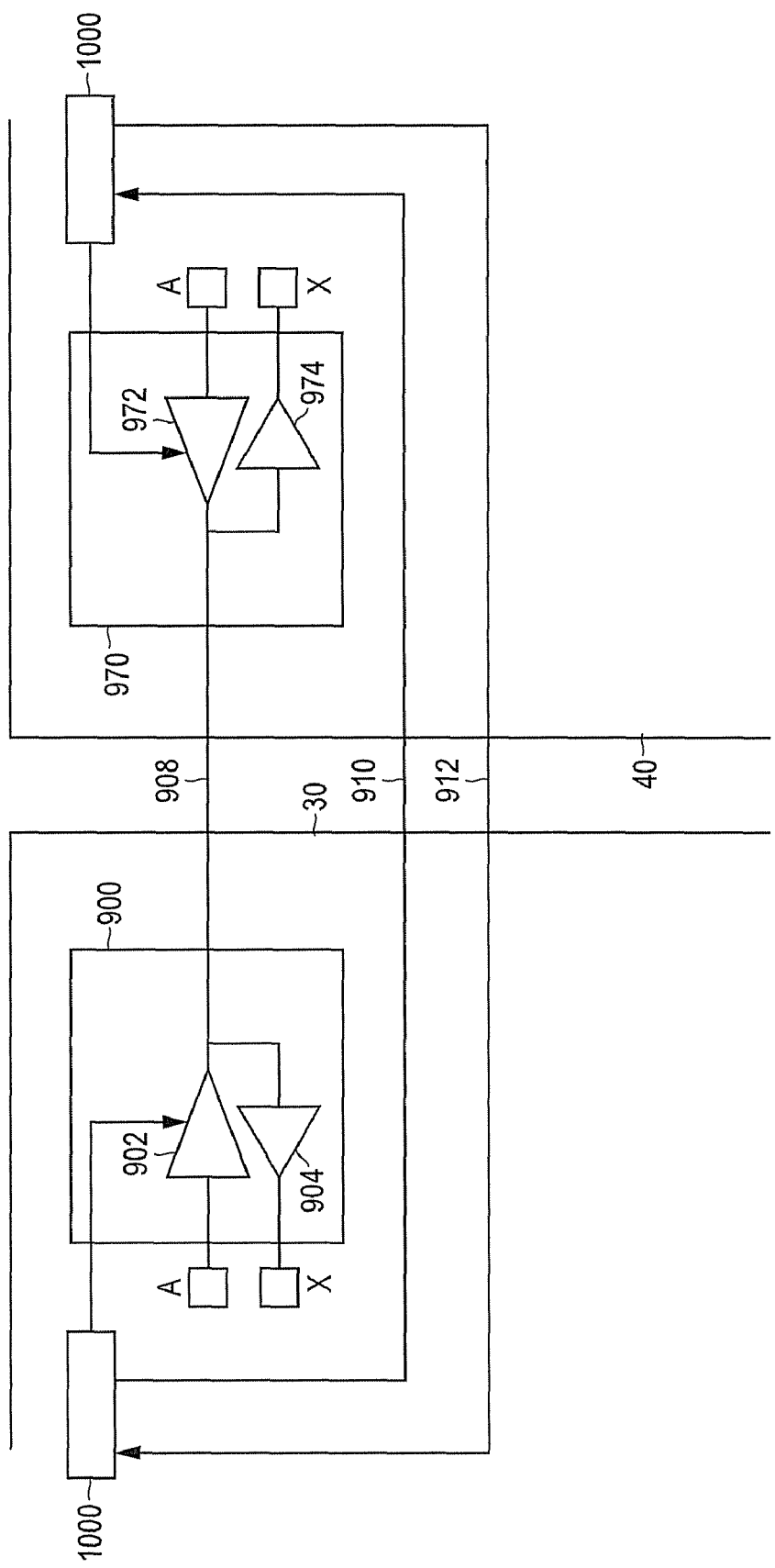
FIG. 4 is a first diagram illustrating a bi-directional buffer.
Figure 5:
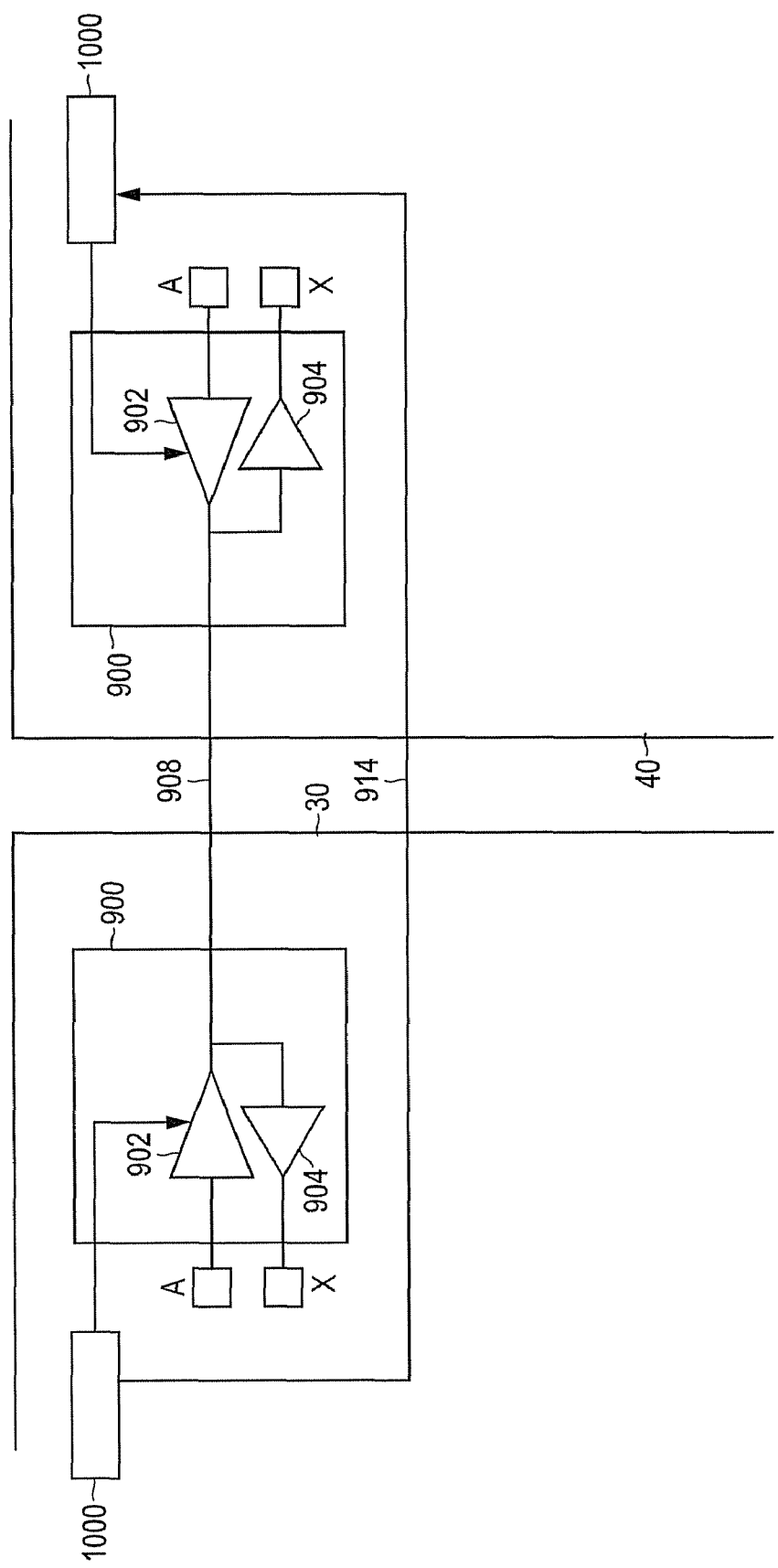
FIG. 5 is a second diagram illustrating a bi-directional buffer.

Finally, advantages of the present embodiment are described. For example, in a bi-directional buffer shown in FIG. 4, two OCD adjustment control means 1000 control bi-directional buffers 900 and 970 via signal lines 910 and 912 so that the bi-directional buffers 900 and 970 enter an input mode. Subsequently, in order to prevent the bi-directional buffers 900 and 970 from performing an adjustment operation at the same time, it is determined which one of the bi-directional buffers 900 and 970 controls the output driver first. For example, an output driver 902 of the bi-directional buffer 900 disposed in a device 30 outputs, via a bi-directional bus 908, a signal input from an input end A to an input buffer 974 of the bi-directional buffer 970 disposed in a device 40. The input buffer 974 outputs the input signal through an output end X. In addition, for example, an output driver 972 of the bi-directional buffer 970 disposed in the device 40 outputs, via the bi-directional bus 908, a signal input from the input end A to an input buffer 904 of the bi-directional buffer 900 disposed in a device 30. The input buffer 974 outputs the input signal from the output end X. Furthermore, in the OCD function of a double data rate 2-synchronous dynamic random access memory (DDR2-SDRAM) as shown in FIG. 5, one of the devices (a memory control device in the case of a DDR2-SDRAM) needs to control the device 30 and the device 40 via a signal line 914.

In contrast, according to the present embodiment, since the adjusting bi-directional buffer 700 is connected to neither one of the other bi-directional buffers, the adjusting bi-directional buffer 700 can adjust the output of the output driver at any time regardless of the mode of the bi-directional buffer to which a signal is output. In addition, the need for control of a direction of the transmitted or received signal of the bi-directional buffer to which a signal is output can be eliminated. Thus, a time required for controlling the direction in which a signal is transmitted and received can be decreased and, therefore, the adjustment signal of the output driver can be applied to a different bi-directional buffer. Consequently, a time required for system startup can be reduced.

While the present invention has been described in the context of specific embodiments thereof, other alternatives, modifications, and variations will become apparent to those skilled in the art having read the foregoing description. Accordingly, it is intended to embrace those alternatives, modifications, and variations as fall within the broad scope of the appended claims.

Figure 6:
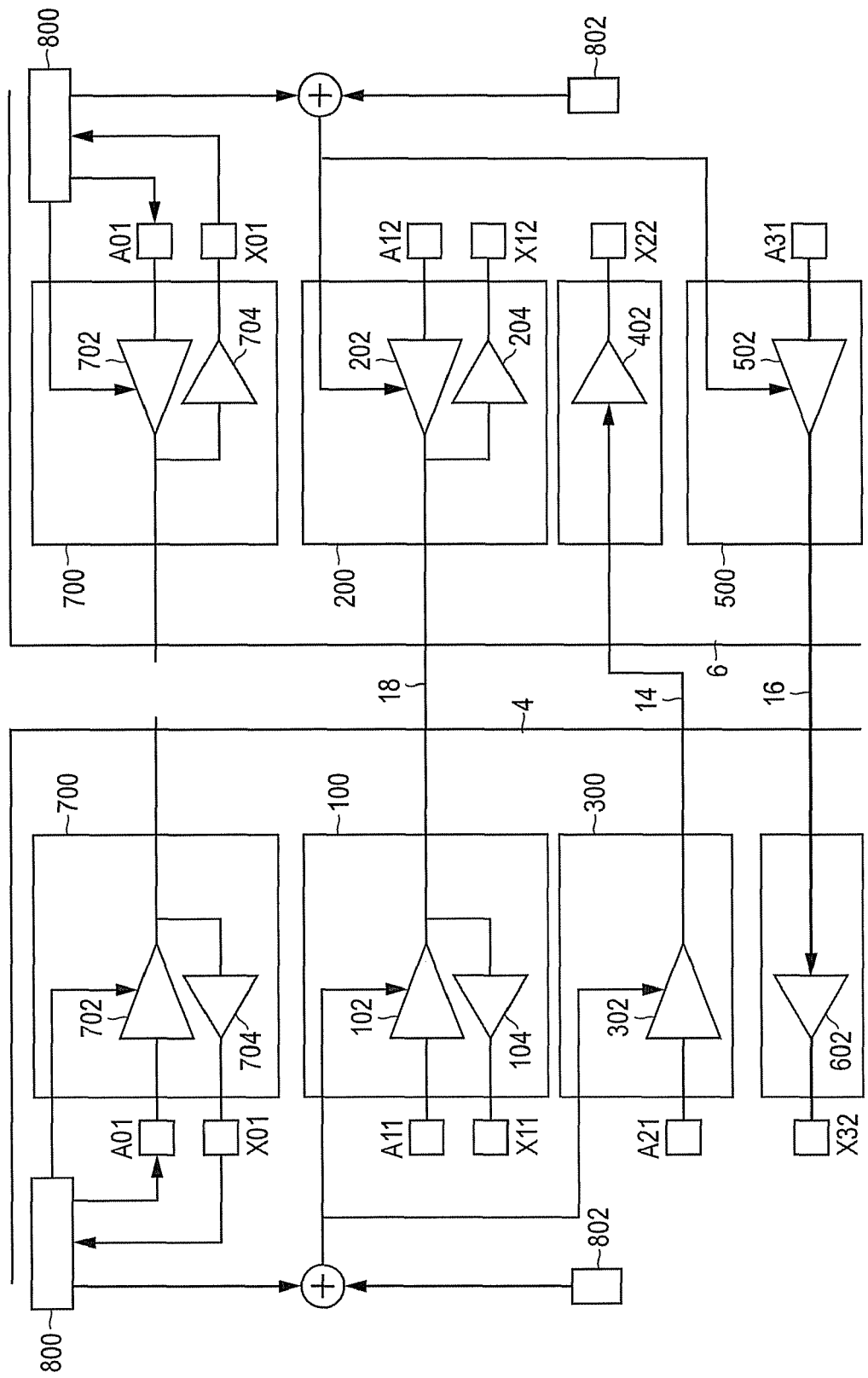
FIG. 6 is a second diagram illustrating a relationship between a bi-directional buffer and an adjusting bi-directional buffer.

According to the present embodiment, since the adjusting bi-directional buffer 700 is not connected to any other bi-directional buffer, an adjustment signal may have an error between the adjusting bi-directional buffer 700 and each of the bi-directional buffer to be adjusted and the output driver. Accordingly, as shown in FIG. 6, adjusting means for adjusting the adjustment signal is provided.

Components other than adjusting means 802 are similar to those described above. Therefore, the descriptions thereof are not repeated. The adjusting means 802 sets, as correction values, the values of the input loads of the bi-directional buffer and the input buffer respectively connected to the bi-directional buffer to be adjusted and the output buffer and a setting value corresponding to the interconnection load of a printed circuit board. Subsequently, the adjusting means 802 adjusts the adjustment signal determined by the OCD adjustment control means using the correction values. For example, the correction value is computed as follows. A correction value is computed by simulation using variations in output caused by the adjustment signal, the input load of a connection buffer, and the load of interconnection lines of the printed circuit board. Alternatively, for example, by changing the correction value automatically or manually and measuring the actual waveform of the signal, the optimal correction value may be computed. Still alternatively, fixed values may be preset as default values.

As mentioned above, the present invention has been specifically described for better understanding of the embodiments thereof and the above description does not limit other aspects of the invention. Therefore, the present invention can be altered and modified in a variety of ways without departing from the gist and scope thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A circuit device comprising:
   a first bi-directional buffer including
      a first output buffer configured to output a first output signal, and
      a first input buffer connected to the first output buffer and configured to receive the first output signal;
   an adjustment controller configured to output a first bi-directional buffer control signal to the first bi-directional buffer for adjusting a voltage level of the first output signal, to monitor an output of the first input buffer, and to adjust the first bi-directional buffer control signal based on the monitoring of the output of the first input buffer; and
   a second bi-directional buffer including
      a second output buffer that outputs a second output signal, and
      a second input buffer connected to the second output buffer, wherein
      the adjustment controller outputs a second bi-directional buffer control signal to the second bi-directional buffer for adjusting a voltage level of the second output signal based on the monitoring of the first bi-directional buffer, and
      the first bi-directional buffer is not connected to the second bi-directional buffer.

2. The circuit device of claim 1, wherein the adjustment controller adjusts the control signal until the monitored output of the first input buffer becomes a high level.

3. The circuit device of claim 2, wherein the adjustment controller outputs the adjusted control signal to an adjustment circuit when the monitored output of the first input buffer becomes a high level.

4. The circuit device of claim 1, wherein the adjustment controller adjusts the control signal until the monitored output of the first input buffer becomes a low level.

5. The circuit device of claim 4, wherein the adjustment controller outputs the adjusted control signal to an adjustment circuit when the monitored output of the first input buffer becomes a low level.

6. The circuit device of claim 1, wherein the first output buffer is an active state when monitoring of the output of the first input buffer and adjusting the control signal.

7. The circuit device of claim 1, further comprising a second adjustment controller for adjusting the output of the second output buffer.

8. The circuit device of claim 1, wherein
the second output buffer is operable either in an active state or a non-active state, and outputs the second output signal when the second output buffer is in the active state.

9. A method of controlling a circuit including a first bi-directional buffer including a first output buffer and a first input buffer connected to the first output buffer, an adjustment controller, a second bi-directional buffer including a second output buffer and a second input buffer connected to the second output buffer, the first bi-directional buffer not being connected to the second bi-directional buffer, the method comprising:
outputting a first output signal by the first output buffer;
outputting a first bi-directional buffer control signal by the adjustment controller to the first bi-directional buffer for adjusting a voltage level of a first output signal that is output from the first output buffer;
monitoring an output of the first input buffer by the adjustment controller;
adjusting the first bi-directional buffer control signal based on the monitoring of the output of the first input buffer by the adjustment controller; and
outputting a second bi-directional buffer control signal to the second bi-directional buffer for adjusting a voltage level of a second output signal that is output from the second output buffer based on the monitoring of the first bi-directional buffer.

10. The method of claim 9, wherein the adjustment controller adjusts the control signal until the monitored output of the first input buffer becomes a high level.

11. The method of claim 10, wherein the adjustment controller outputs the adjusted control signal to an adjustment circuit when the monitored output of the first input buffer becomes a high level.

12. The method of claim 9, wherein the adjustment controller adjusts the control signal until the monitored output of the first input buffer becomes a low level.

13. The method of claim 12, wherein the adjustment controller outputs the adjusted control signal to an adjustment circuit when the monitored output of the first input buffer becomes a low level.

14. The method of claim 9, wherein the first output buffer is an active state when monitoring of the output of the first input buffer and adjusting the control signal.

15. The method of claim 9, further comprising adjusting output of the second output buffer.

16. A circuit device comprising:
a bi-directional buffer including
an output buffer that outputs a first output signal, and
an input buffer, connected to the output buffer, that receives the first output signal and outputs a second output signal; and
an adjustment circuit that monitors the second output signal, adjusts a voltage level of the first output signal based on the monitored second output signal, and adjusts a voltage level of an output signal from an output buffer fo another bi-directional buffer, not connected to said bi-directional buffer, based on the monitored second output signal of said bi-directional buffer.

17. The method of claim 9, further comprising:
outputting a second output signal by the second output buffer operable either in an active state or a non-active state, and
when the second output buffer is in the active state, a voltage level of the second output buffer being adjusted based on the second bi-directional buffer control signal output by the adjustment controller.

* * * * *

UNITED STATES PATENT AND TRADEMARK OFFICE
CERTIFICATE OF CORRECTION

PATENT NO. : 8,339,162 B2
APPLICATION NO. : 12/770030
DATED : December 25, 2012
INVENTOR(S) : Toshihide Tsuzuki et al.

It is certified that error appears in the above-identified patent and that said Letters Patent is hereby corrected as shown below:

Column 10, Line 26, In Claim 16, delete "fo" and insert -- of --, therefor.

Signed and Sealed this
Twenty-sixth Day of March, 2013

Teresa Stanek Rea
*Acting Director of the United States Patent and Trademark Office*